United States Patent
Shimoda et al.

(10) Patent No.: US 10,539,240 B2
(45) Date of Patent: Jan. 21, 2020

(54) GATE-VALVE ATTACHING STRUCTURE

(71) Applicant: SMC CORPORATION, Chiyoda-ku (JP)

(72) Inventors: Hiromi Shimoda, Noda (JP); Hiroshi Ogawa, Okegawa (JP)

(73) Assignee: SMC CORPORATION, Chiyoda-ku (JP)

( * ) Notice: Subject to any disclaimer, the term of this patent is extended or adjusted under 35 U.S.C. 154(b) by 0 days.

(21) Appl. No.: 16/041,023

(22) Filed: Jul. 20, 2018

(65) Prior Publication Data

US 2019/0032795 A1     Jan. 31, 2019

(30) Foreign Application Priority Data

Jul. 25, 2017  (JP) ................. 2017-143480

(51) Int. Cl.

| | |
|---|---|
| *F16K 3/30* | (2006.01) |
| *F16K 3/02* | (2006.01) |
| *F16K 51/02* | (2006.01) |
| *H01L 21/67* | (2006.01) |

(52) U.S. Cl.
CPC .............. *F16K 3/30* (2013.01); *F16K 3/0227* (2013.01); *F16K 51/02* (2013.01); *H01L 21/67017* (2013.01); *Y10T 137/6072* (2015.04)

(58) Field of Classification Search
CPC .......... F16K 3/30; F16K 3/0227; F16K 51/02; Y10T 137/6072
See application file for complete search history.

(56) References Cited

U.S. PATENT DOCUMENTS

| | | | |
|---|---|---|---|
| 5,881,998 A * | 3/1999 | Brenes .................... | F15B 15/16 251/204 |
| 2005/0058554 A1 | 3/2005 | Fahrenbach et al. | |
| 2007/0012894 A1 | 1/2007 | Chen | |
| 2013/0153806 A1 | 6/2013 | Choi et al. | |

(Continued)

FOREIGN PATENT DOCUMENTS

| | | |
|---|---|---|
| EP | 1 517 045 A2 | 3/2005 |
| EP | 2 541 591 A2 | 1/2013 |

(Continued)

OTHER PUBLICATIONS

Extended European Search Report dated Dec. 19, 2018 in Patent Application No. 18183620.6, 8 pages.

*Primary Examiner* — Mary E McManmon
*Assistant Examiner* — Kevin R Barss
(74) *Attorney, Agent, or Firm* — Oblon, McClelland, Maier & Neustadt, L.L.P.

(57) ABSTRACT

A valve fixing mechanism for fixing protruding walls of valve housings of adjacent gate valves to a chamber in a fixing space defined between the valve housings includes a support member fixed to the chamber in middle part of the fixing space and a pair of lever members arranged on both sides of the support member. The pair of lever members each include fulcrum part, load part, and effort part arranged in that order from the middle part of the fixing space to an opening at either end of the fixing space. The fulcrum part is supported by the support member, and a force is applied to the effort part by a fixing operation bolt, so that both the load part and the effort part press the protruding walls of the valve housings against the chamber.

9 Claims, 12 Drawing Sheets

(56) References Cited

U.S. PATENT DOCUMENTS

| | | | |
|---|---|---|---|
| 2014/0003892 A1 | 1/2014 | Yamamoto et al. | |
| 2016/0189987 A1* | 6/2016 | Amikura | H01L 21/67069 |
| | | | 156/345.29 |
| 2017/0089472 A1 | 3/2017 | Kim et al. | |
| 2017/0294325 A1* | 10/2017 | Hunter | H01L 21/67248 |
| 2018/0096866 A1* | 4/2018 | Midorikawa | H01L 21/67017 |
| 2018/0151336 A1* | 5/2018 | Sakka | H01J 37/32899 |
| 2019/0172689 A1* | 6/2019 | Nagaseki | H01J 37/32834 |

FOREIGN PATENT DOCUMENTS

| | | | |
|---|---|---|---|
| JP | 2012-197476 | 10/2012 | |
| JP | 2013-128117 | 6/2013 | |
| JP | 2016-23659 A | 2/2016 | |
| JP | 6388182 B1 * | 9/2018 | F16K 3/0227 |

\* cited by examiner

GATE-VALVE ATTACHING STRUCTURE

TECHNICAL FIELD

The present invention relates to an attaching structure for firmly attaching a gate valve to two chambers, such as a processing chamber and a transfer chamber, in semiconductor manufacturing equipment, for example, such that the gate valve is disposed between the two chambers to allow the chambers to communicate with each other or, alternatively, to be airtightly separated from each other.

BACKGROUND ART

For example, in a substrate processing apparatus of semiconductor manufacturing equipment, as disclosed in PTL 1 and PTL 2, a gate valve is installed between a processing chamber and a transfer chamber arranged adjacent to each other so that these chambers are allowed to communicate with each other or, alternatively, to be separated from each other.

The above-described gate valve includes a hollow valve housing having gate openings in side walls of the housing facing away from each other and a plate-shaped valve element in the housing. The valve element is moved in a direction along the side walls and in a direction toward or away from either side wall to open or close the gate opening, thus allowing these gate openings to communicate with each other or to be separated from each other.

The two chambers each have a chamber opening through which a workpiece is loaded into or unloaded from the chamber by a robot arm, for example. The gate valve is airtightly fixed to the two chambers by fixing members, such as bolts, such that the gate openings are connected to the chamber openings.

In coupling two chambers to a gate valve interposed between the chambers, a plurality of gate valves may be arranged adjacent to each other between these chambers and be attached to the chambers.

Chambers have recently been required to be downsized. When a plurality of gate valves are arranged adjacent to each other between two downsized chambers and are fixed to the chambers in the above-described manner, the gap between valve housings of the adjacent gate valves is very small. When the gate valves fixed to one of the chambers are fixed to the other chamber, it is therefore very difficult to tighten a fixing member disposed in the gap between the adjacent valve housings, particularly, in middle part of the gap because it is difficult for a tool to reach the middle part and the tool can be handled in a limited small area in the middle part. Unfortunately, airtightness may fail to be sufficiently achieved between the gate valves and the other chamber.

CITATION LIST

Patent Literature

[PTL 1] Japanese Unexamined Patent Application Publication No. 2012-197476

[PTL 2] Japanese Unexamined Patent Application Publication No. 2013-128117

SUMMARY OF INVENTION

Technical Problem

Accordingly, the technical problem of the present invention is to provide a gate-valve attaching structure that achieves enhanced airtightness in firm attachment of a plurality of gate valves between two chambers.

Solution to Problem

To overcome the above-described problem, the present invention provides a gate-valve attaching structure for firmly attaching a plurality of gate valves adjacent to each other between a first chamber and a second chamber each having a plurality of chamber openings. Each gate valve includes a hollow valve housing having a pair of gate openings, a valve body moving in the valve housing to establish or interrupt communication between the pair of gate openings, and a valve drive unit operating the valve body. The valve housing has a pair of side wall faces having the gate openings and facing away from each other and a pair of side end faces coupling opposite side ends of the side wall faces and facing away from each other, and is fixed to both the first chamber and the second chamber such that the pair of gate openings are connected to the chamber openings of the first and second chambers and the pair of side wall faces are airtightly pressed against the first and second chambers. The side end faces, facing each other, of the valve housings of the adjacent gate valves define a fixing space having an axis extending along the side ends of the side wall faces, the fixing space has a first end and a second end in a direction along the axis, the first and second ends serve as openings, the side end faces facing each other include a pair of protruding walls extending along the axis and protruding from the respective side end faces into the fixing space, and the fixing space accommodates a valve fixing mechanism for fixing the gate valves to the second chamber. The valve fixing mechanism includes a support member fixed to the second chamber in middle part of the fixing space in the direction along the axis, a pair of lever members each including fulcrum part in pressure contact with a supporting portion, facing toward the second chamber, of the support member, load part in contact with the pair of protruding walls to exert a pressing force on the second chamber, and effort part to which a force directed toward the second chamber is applied, and a pair of fixing operation members applying the force to the effort part of each lever member and pressing the pair of protruding walls against the second chamber, and the pair of lever members are arranged on both sides of the support member in the direction along the axis such that the effort parts of the lever members are located closer to the openings at the first and second ends than the load parts.

In the gate-valve attaching structure, preferably, the support member includes a strut extending from the second chamber and a pair of flanges extending from the strut toward the openings at the first and second ends, and the flanges each have a surface that faces toward the second chamber and serves as the supporting portion.

More preferably, each lever member has a surface facing toward the second chamber, the surface is a sloping face formed by gradually increasing the thickness of the lever member along the axis from an end adjacent to the fulcrum part to the load part, and the thickness of the fulcrum part of the lever member is smaller than a perpendicular distance between the supporting portion of the support member and pressed faces, which are in contact with the load part, of the pair of protruding walls.

Still more preferably, each of the pressed faces of the pair of protruding walls is formed of a flat surface extending along the axis, each lever member has a flat pressing face extending along the axis from the load part to an end adjacent to the effort part, and the pressing face is in contact with the pressed face to press the pair of protruding walls against the second chamber.

The supporting portion of the support member may be formed of a flat surface parallel to the pressed faces of the pair of protruding walls, and the fulcrum part of each lever member may be formed of a flat surface parallel to the pressing face.

Furthermore, in the gate-valve attaching structure, preferably, each fixing operation member is a fixing operation bolt, the fixing operation bolt extends through a through-hole provided in the effort part of each lever member and is screwed in a screw hole provided in the second chamber, the force directed toward the second chamber is applied to the effort part, and the load part and the effort part of the lever member are in contact with the pair of protruding walls to press the protruding walls against the second chamber.

More preferably, the fixing operation bolt includes an externally threaded screw body and a screw head joined to the screw body and having a larger outside diameter than the screw body, the through-hole of the lever member is an elongated hole having a length in the direction along the axis, the through-hole has a width smaller than the outside diameter of the screw head, and the screw head applies the force directed toward the second chamber to the effort part of the lever member.

More preferably, the pair of protruding walls each have a pressed face, formed of a flat surface extending along the axis, with which the load part is in contact, the lever member has a flat pressing face extending along the axis from the load part to an end adjacent to the effort part, and the pressing face is in contact with the pressed face to press the pair of protruding walls against the second chamber.

The supporting portion of the support member may be formed of a flat surface parallel to the pressed faces of the pair of protruding walls, and the fulcrum part of the lever member may be formed of a flat surface parallel to the pressing face.

Advantageous Effects of Invention

As described above, according to the present invention, the valve fixing mechanism is disposed in the fixing space defined between the adjacent valve housings in order to firmly attach the plurality of gate valves arranged adjacent to each other between the two chambers. The valve fixing mechanism includes the support member located in the middle part of the fixing space in the direction along the axis, the pair of lever members each including the fulcrum part, the load part, and the effort part and attached such that the fulcrum parts are supported by the support member and the effort parts are located closer to the opposite ends of the fixing space in the direction along the axis than the load parts, and the pair of fixing operation members applying the force to the effort parts of the lever members and pressing the protruding walls of the valve housings against the second chamber. In this arrangement, the fixing operation members allow the effort parts located adjacent to the opposite ends in the direction along the axis to press the protruding walls against the second chamber, and the load parts of the lever members are in contact with the pair of protruding walls to exert the pressing force on the second chamber in the middle part in the direction along the axis, which is based on the principle of leverage. Therefore, the gate valves are fixed to the second chamber such that the side wall faces of the valve housings are airtightly pressed against the second chamber not only in the opposite ends of the fixing space in the direction along the axis but also in the middle part thereof. Thus, the two chambers are coupled to the gate valves arranged adjacent to each other between these chambers with enhanced airtightness.

DESCRIPTION OF EMBODIMENTS

Figure 1:
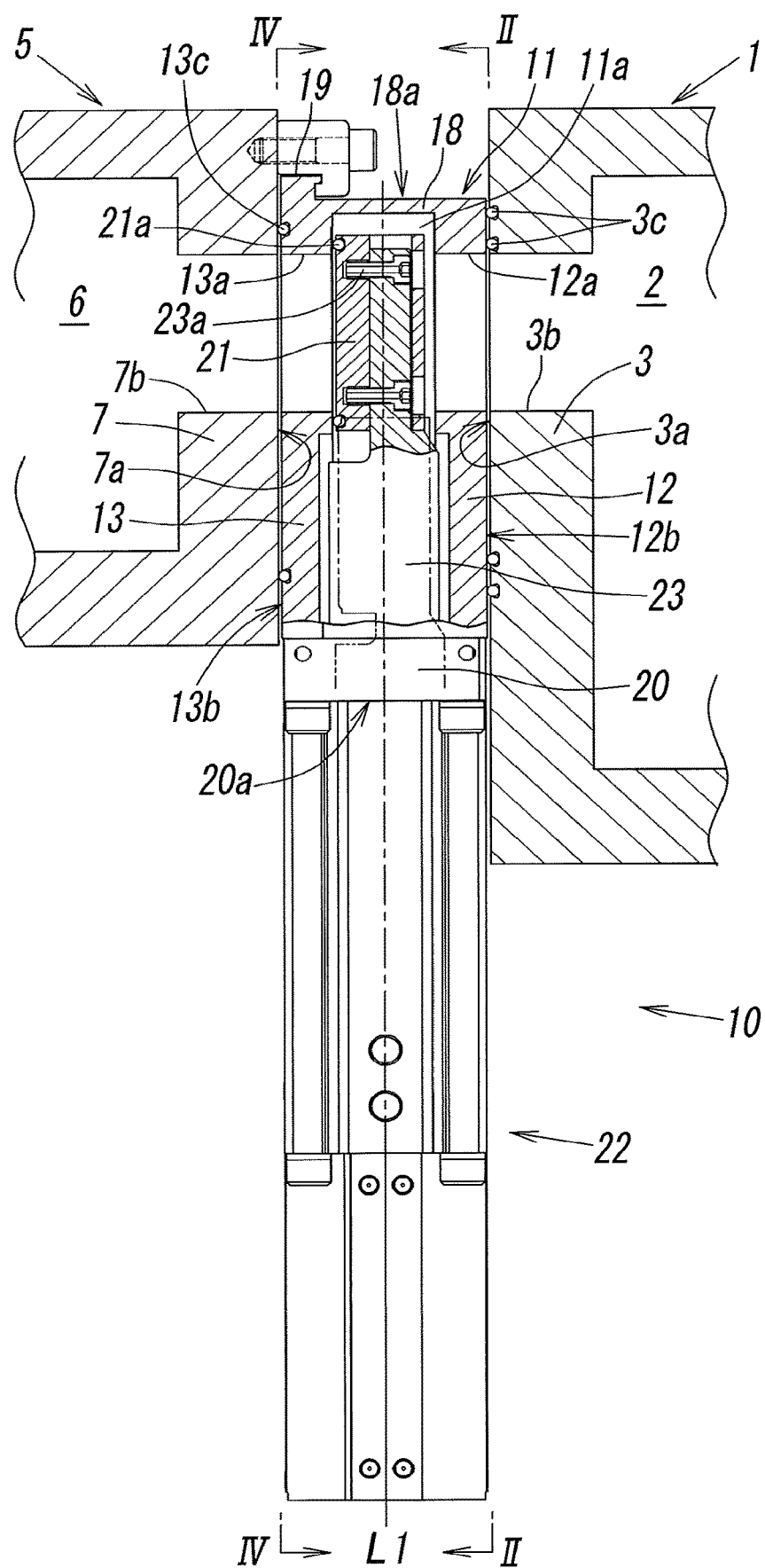
FIG. 1 is a schematic exploded sectional side view of essential part of an embodiment of a gate-valve attaching structure according to the present invention.

An embodiment of a gate-valve attaching structure according to the present invention will be described in detail below with reference to the drawings. In the figures, reference sign 1 denotes a first chamber, serving as a transfer chamber, and reference sign 5 denotes a second chamber, serving as a processing chamber. As illustrated in FIGS. 1 to 5, these chambers 1, 5 are of hollow construction. The first chamber 1 has therein a transfer space 2 through which a workpiece, such as a semiconductor substrate, is loaded into or unloaded from the second chamber 5. The second chamber 5 has therein a processing space 6 in which the workpiece is processed in a vacuum atmosphere.

These first and second chambers 1, 5 respectively have first and second chamber walls 3, 7 having outer surfaces 3a, 7a, each of which is formed of a flat surface. The first chamber wall 3 has two first chamber openings 3b, 3b, which extend through the first chamber wall to the transfer space 2 of the first chamber 1 and are arranged side by side. The second chamber wall 7 has two second chamber openings 7b, 7b (equal in number to the first chamber openings 3b, 3b), which extend through the second chamber wall to the processing space 6 of the second chamber 5 and are arranged side by side. These first chamber openings 3b, 3b and these second chamber openings 7b, 7b are substantially rectangular and have substantially the same shape and dimensions. These chamber openings are arranged side by side in a longitudinal direction of each chamber. The distance between the adjacent first chamber openings 3b, 3b is substantially equal to the distance between the adjacent second chamber openings 7b, 7b.

In the present embodiment, the first and second chambers 1, 5 each having such a configuration are arranged such that the outer surface 3a of the first chamber wall 3 faces and is parallel to the outer surface 7a of the second chamber wall 7 with a predetermined gap therebetween. Consequently, the two first chamber openings 3b, 3b face the two second chamber openings 7b, 7b such that the first chamber openings are paired with the second chamber openings. In the gap between the first chamber 1 and the second chamber 5, two gate valves 10, 10 are arranged adjacent to each other to airtightly connect the pairs of the first and second chamber openings 3b, 3b and 7b, 7b. These gate valves 10, 10 are firmly attached to the first chamber wall 3 and the second chamber wall 7.

Figure 8:
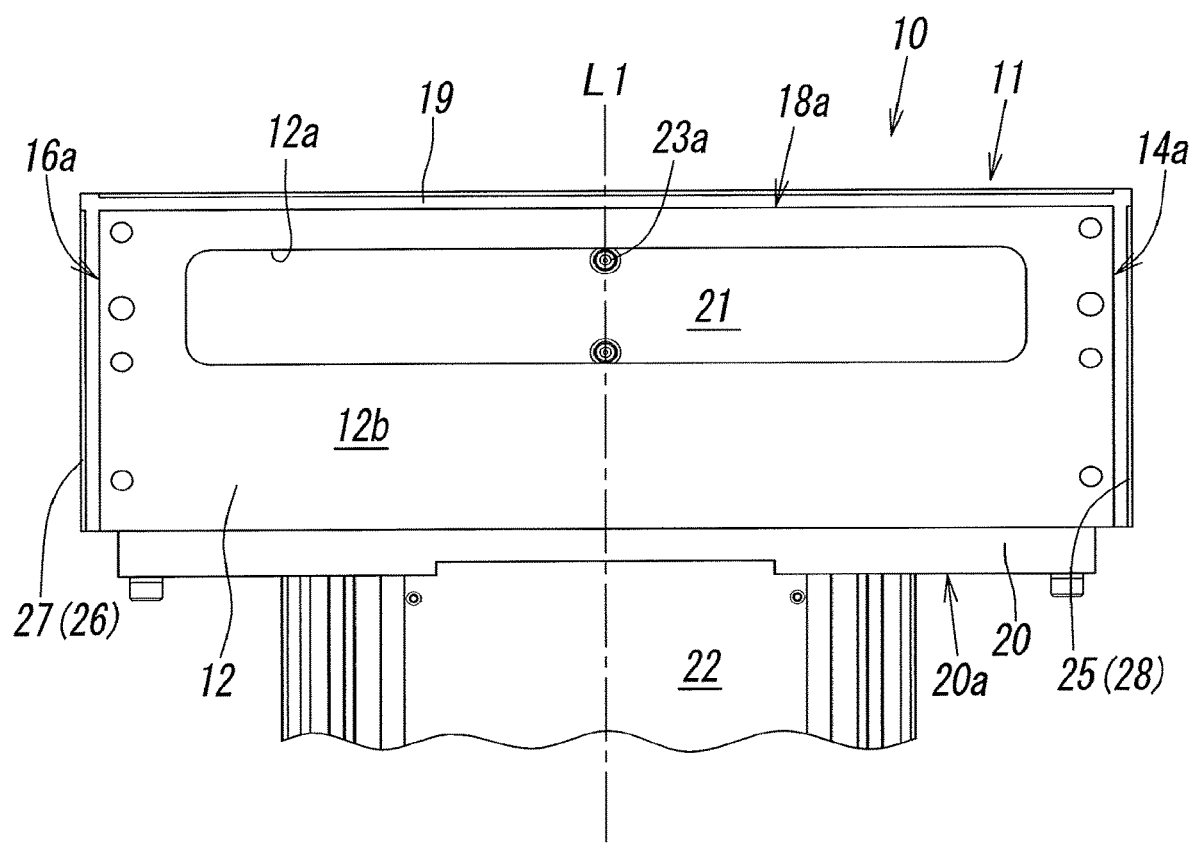
FIG. 8 is a schematic partially-exploded front view of a gate valve in the present invention.
Figure 9:
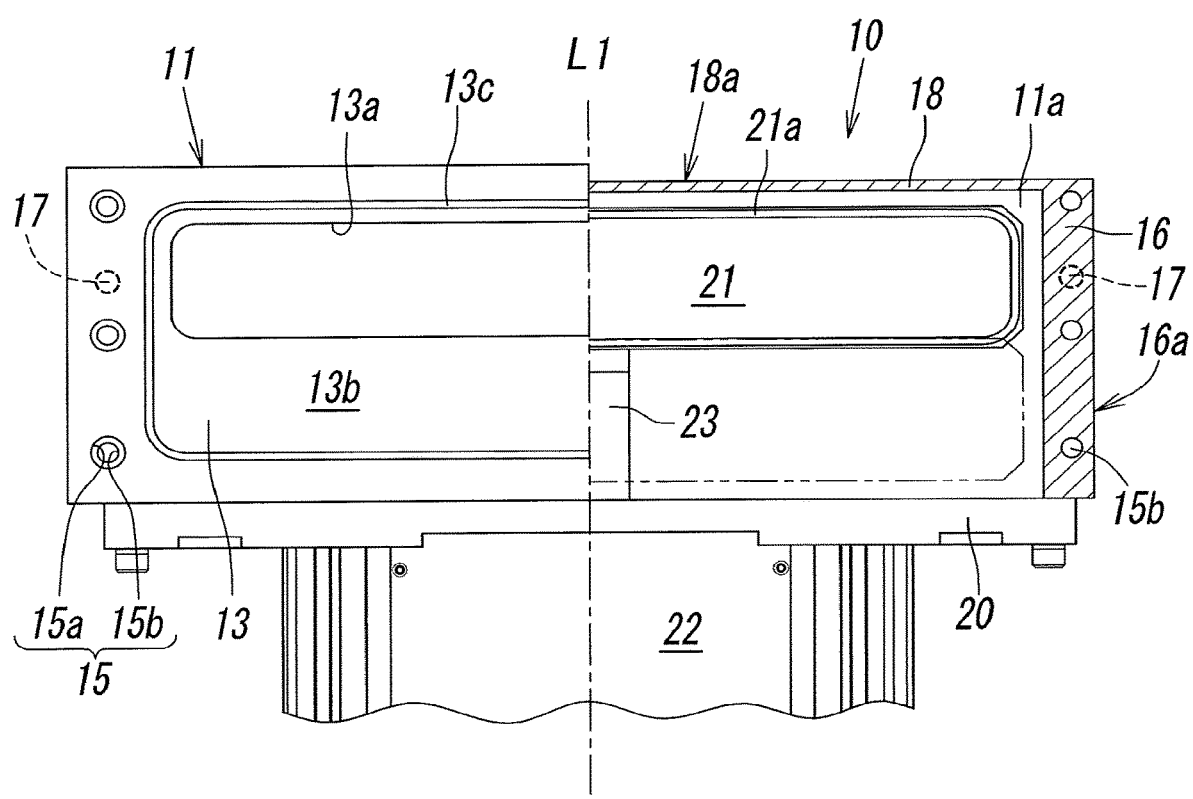
FIG. 9 is a schematic partially-exploded rear view of the gate valve in the present invention.
Figure 10A:
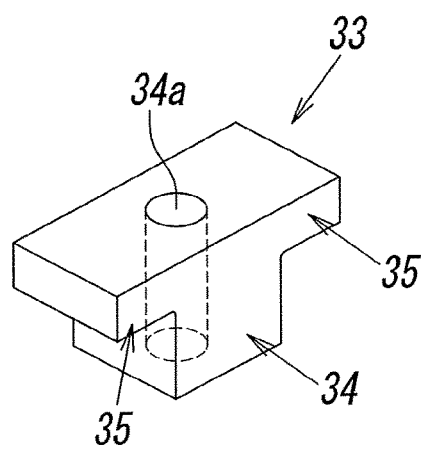
FIG. 10A is perspective views of a support member.
Figure 10B:
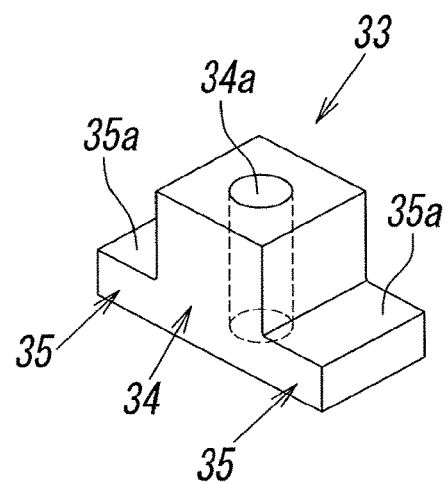
FIG. 10B is perspective views of a support member.
Figure 11A:
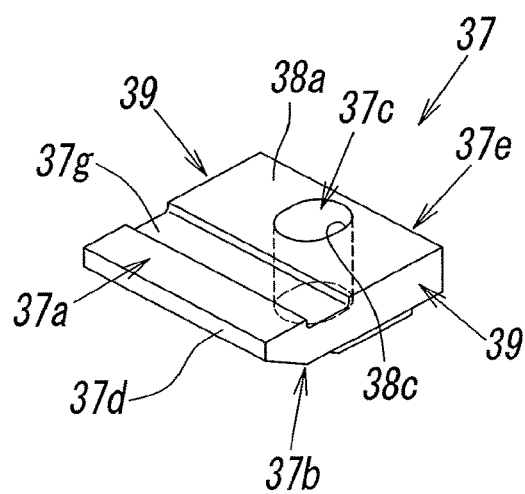
FIG. 11A is perspective views of a lever member.
Figure 11B:
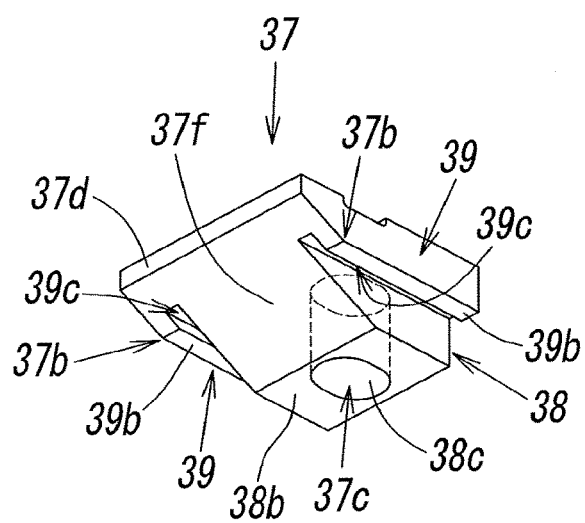
FIG. 11B is perspective views of a lever member.

As illustrated in FIGS. 1, 8, and 9, each gate valve 10 includes a hollow valve housing 11 having a first gate opening 12a and a second gate opening 13a and having therein a valve space 11a, a valve body 21 moving in the valve space 11a to establish or interrupt communication between the paired gate openings 12a, 13a (or cause the gate openings 12a, 13a to communicate with each other through the valve space 11a or to be airtightly separated from each other), a valve drive unit 22 for operating the valve body 21, and a valve shaft 23 extending along an axis L1 and coupling the valve body 21 and the valve drive unit 22 to each other.

More specifically, the valve housing 11, which has the first and second gate openings 12a, 13a in its surfaces (i.e., surfaces facing outward), has first and second side wall faces 12b, 13b facing away from each other, first and second side end faces 14a, 16a coupling opposite side ends of the side wall faces 12b, 13b located at opposite ends thereof in their longitudinal direction (horizontal direction in the figures) orthogonal to the axis L1 and facing away from each other, and first and second peripheral end faces 18a, 20a coupling opposite peripheral ends of the paired side wall faces 12b, 13b located at opposite ends thereof in a direction (vertical direction in the figures) along the axis L1 and facing away from each other.

The paired side wall faces 12b, 13b, the paired side end faces 14a, 16a, and the paired peripheral end faces 18a, 20a are defined by first and second valve side walls 12, 13 respectively having the first and second gate openings 12a, 13a extending through the valve side walls, first and second side end walls 14, 16 coupling opposite side ends of the paired valve side walls 12, 13 located at opposite ends thereof in the longitudinal direction, and first and second peripheral end walls 18, 20 coupling opposite peripheral ends of the paired valve side walls 12, 13 located at opposite ends thereof in a direction along the axis L1. The paired valve side walls 12, 13, the paired side end walls 14, 16, and the paired peripheral end walls 18, 20 are arranged such that the paired walls face each other with the valve space 11a therebetween and are parallel to each other.

The valve body 21 is substantially rectangular plate-shaped and is larger than the second gate opening 13a. The valve body 21 has a sealing face facing the second valve side wall 13, and the sealing face has an outer edge with a looped sealing member 21a, which is movable to and away from an inner surface of the valve side wall 13. In the middle of the valve body 21 in its longitudinal direction, a distal end of the valve shaft 23 in the direction along the axis L1 is fixed to a rear surface of the valve body 21 opposite from the sealing face by bolts 23a, serving as fixing members. A proximal end of the valve shaft 23 in the direction along the axis L1 airtightly and slidably extends through the second end wall 20, and is coupled to the valve drive unit 22.

The valve drive unit 22 is located on the axis L1. The width of the valve drive unit 22 in a direction orthogonal to the axis L1 is smaller than that of the valve housing 11. The valve drive unit includes a valve drive mechanism (not illustrated) that drives the valve shaft to move the valve body 21 between a closing position (position indicated by a solid line in FIGS. 1 and 9), where the second gate opening 13a is airtightly closed to airtightly close communication between the first and second chambers 1, 5 (i.e., between the transfer space 2 and the processing space 6), and a retracted position (position indicated by an alternate long and two short dashes line in FIGS. 1 and 9), where the first and second gate openings 12a, 13a are allowed to communicate with each other to establish the communication between the first and second chambers 1, 5. The valve drive mechanism is known, and a detailed description of the mechanism is omitted herein.

The two identical gate valves 10, 10 having such a configuration are fixed to each of the first and second chambers 1, 5 by a structure, which will be described later, such that the first and second gate openings 12a, 13a are connected to the two pairs of the first and second chamber openings 3b, 7b in the first and second chambers 1, 5. In this arrangement, looped sealing members 3c is disposed between each first valve side wall 12 and the first chamber wall 3 so as to surround the first chamber opening 3b and the first gate opening 12a, and a looped sealing member 13c is disposed between each second valve side wall 13 and the second chamber wall 7 so as to surround the second chamber opening 7b and the second gate opening 13a. Therefore, the side wall faces 12b, 13b, formed of completely flat surfaces, of the first and second valve side walls 12, 13 are respectively pressed airtightly against the outer surfaces 3a, 7a, also formed of completely flat surfaces, of the first and second chamber walls 3, 7.

The structure for attaching the two gate valves 10, 10 to the first and second chambers 1, 5 will now be specifically described.

Figure 4:
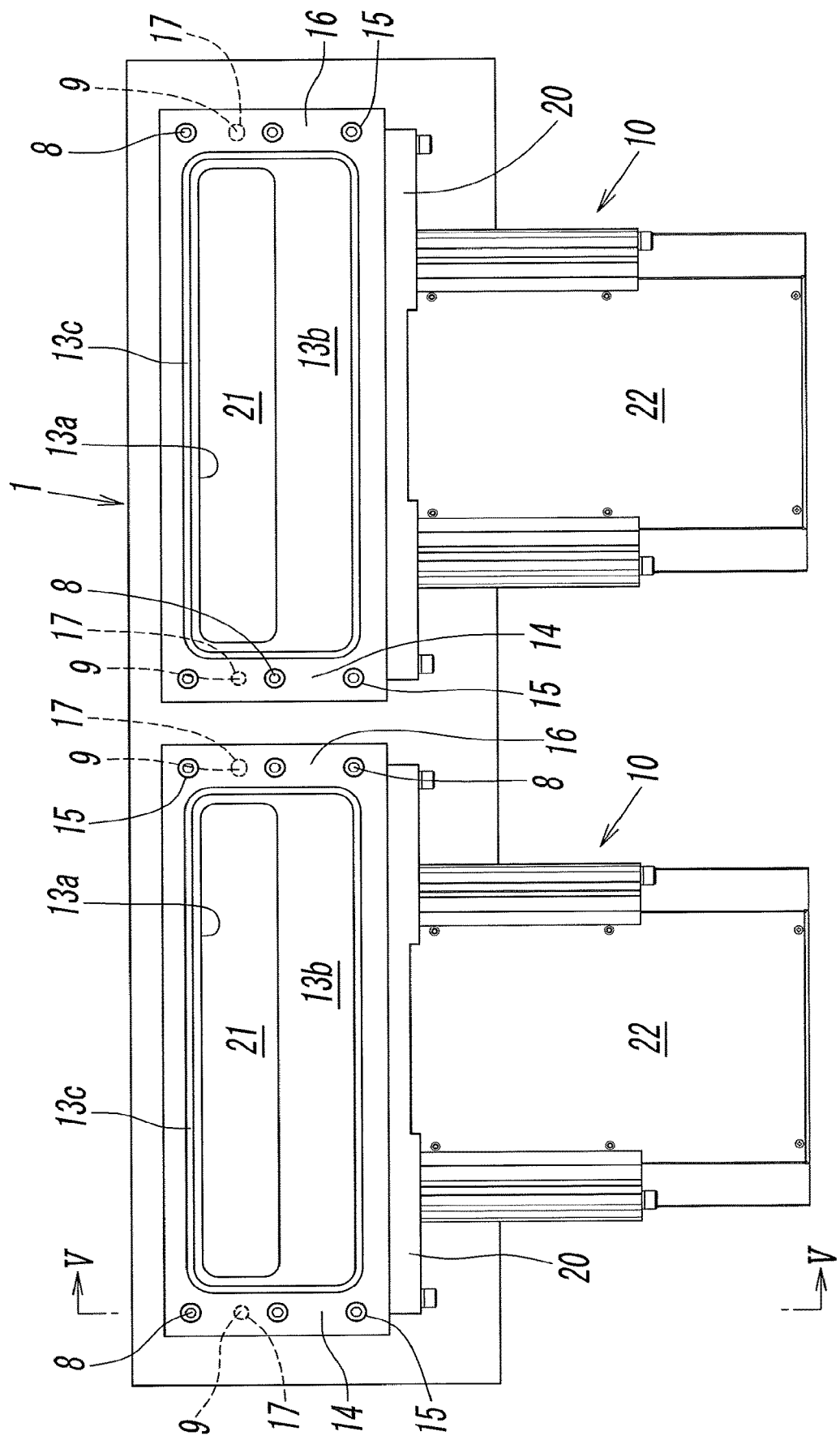
FIG. 4 is a schematic sectional view, in which various members for fixing gate valves to a second chamber are omitted from depiction, taken along line IV-IV in FIG. 1.
Figure 5:
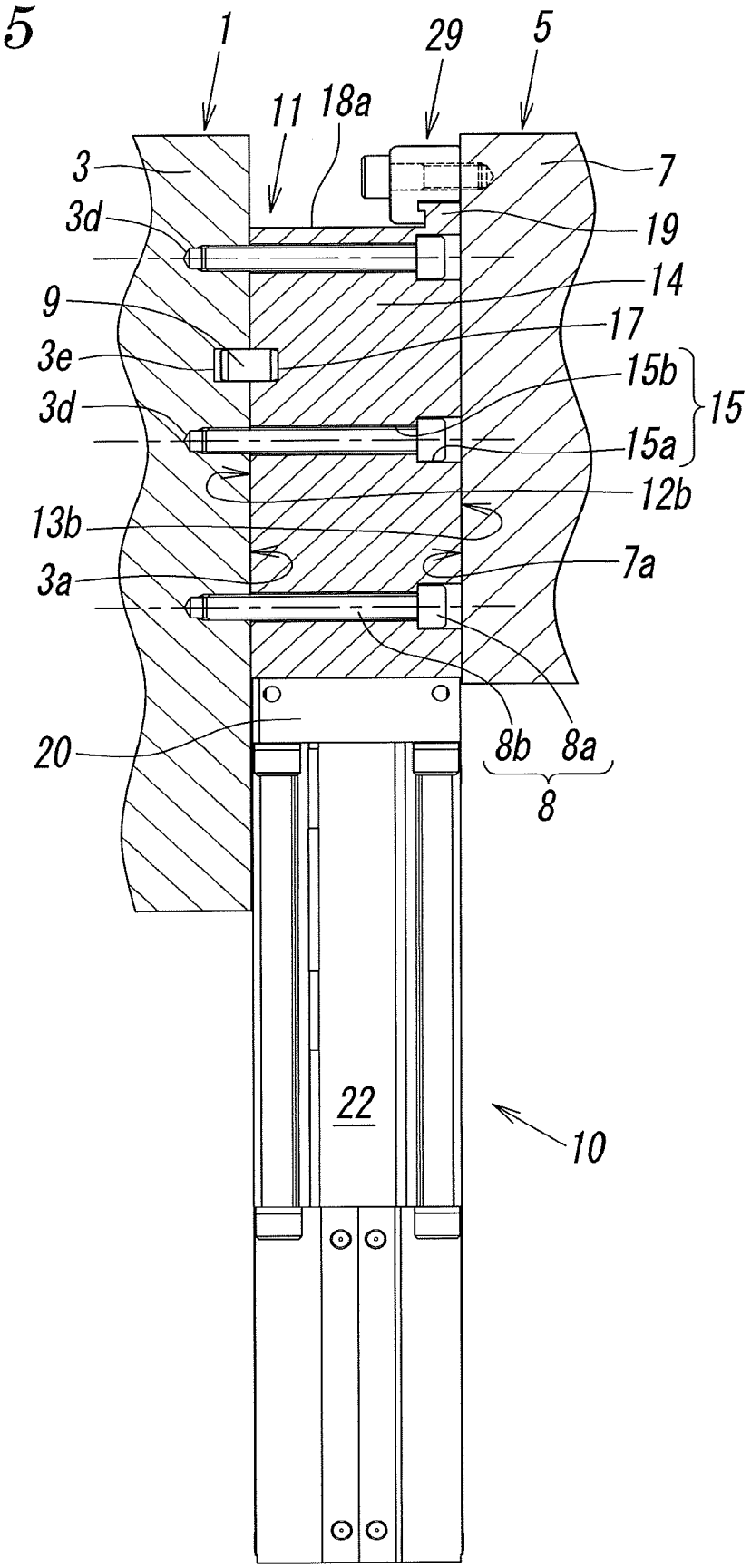
FIG. 5 is a sectional view taken along line V-V in FIG. 4.

As illustrated in FIGS. 4, 5, and 9, in the valve housing 11 of each gate valve 10, the first and second side end walls 14, 16 each have three fixing holes 15, through each of which a first fixing bolt 8 extends, extending between the second side wall face 13b and the first side wall face 12b and a first positioning hole 17, in which one end of a positioning pin 9 is fitted, located in the first side wall face 12b. In this arrangement, the three fixing holes 15 are aligned in a longitudinal direction (vertical direction in the figures) of each of the side end walls 14, 16 such that the holes are arranged in one end part (upper end part in the figures), the other end part (lower part in the figures), and intermediate part between them. The first positioning hole 17 is located midway between the two fixing holes 15, 15 arranged in the one end part and the intermediate part.

Each fixing hole 15 includes a large diameter portion 15a opening into the second side wall face 13b and a small diameter portion 15b opening into the first side wall face 12b. The first fixing bolt 8 includes a screw head 8a having a larger diameter than the small diameter portion 15b and a smaller axial length than the large diameter portion 15a and further includes an externally threaded screw body 8b having a smaller diameter than the small diameter portion 15b and a larger axial length than the small diameter portion 15b.

The first chamber wall 3 of the first chamber 1 has fixing screw holes 3d, in each of which the first fixing bolt 8 is screwed, and second positioning holes 3e, in each of which the other end of the positioning pin 9 is fitted, such that the fixing screw holes 3d are located to correspond to the fixing holes 15 and the second positioning holes 3e are located to correspond to the first positioning holes 17.

Specifically, the opposite ends of the positioning pins 9 are fitted in the first positioning holes 17, 17 of the first and second side end walls 14, 16 of each gate valve 10 and the second positioning holes 3e, 3e of the first chamber wall 3, thus positioning the gate valve 10 on the first chamber wall 3. In this arrangement, the first chamber opening 3b coincides with the first gate opening 12a. The first fixing bolt 8 extends from the second side wall face 13b, in contact with the second chamber wall 7, through each of the fixing holes 15 of the first and second side end walls 14, 16 of each gate valve 10, and is screwed in the fixing screw hole 3d of the first chamber wall 3. Thus, the gate valves 10, 10 are airtightly fixed to the first chamber wall 3.

Figure 2:
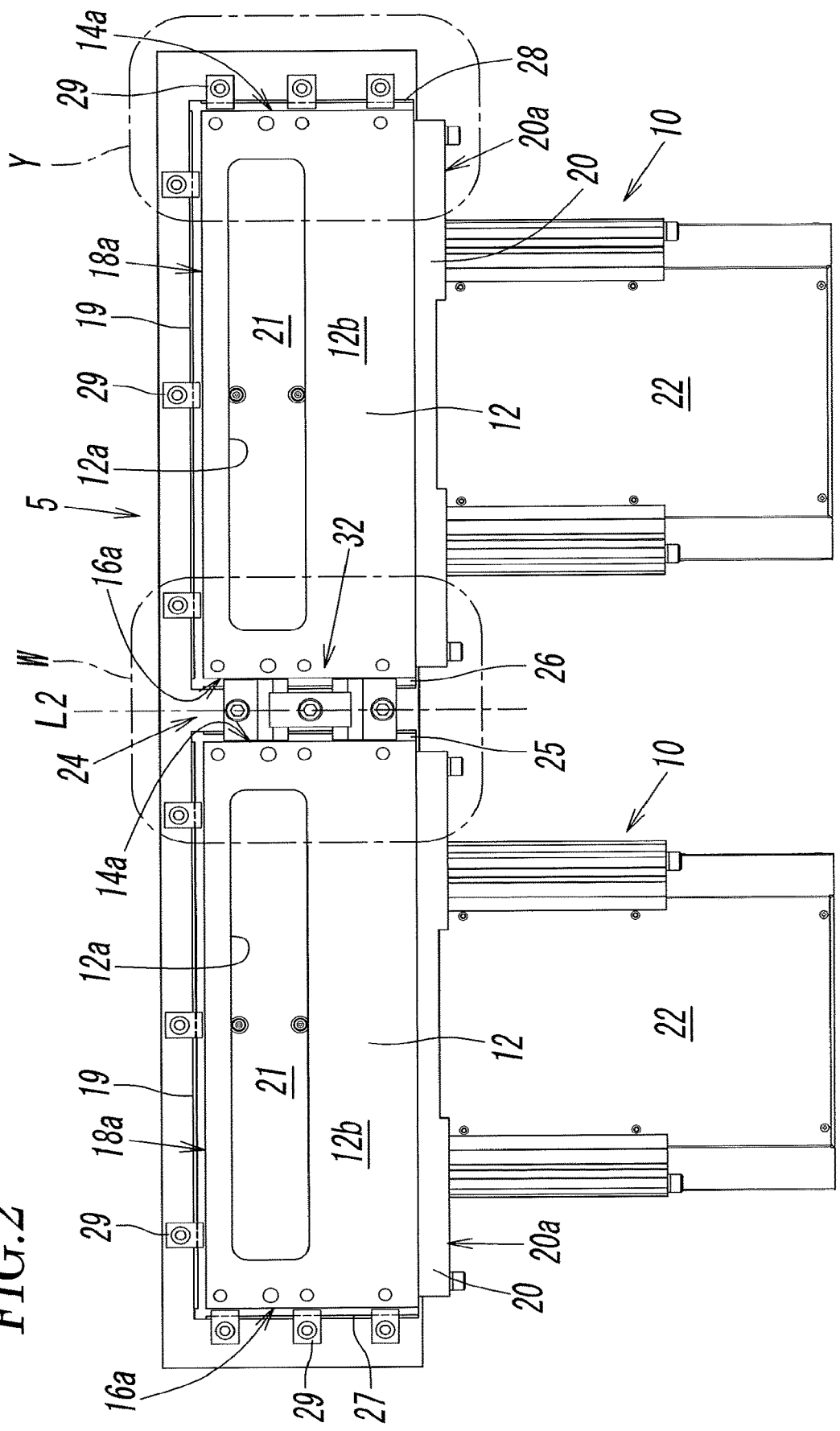
FIG. 2 is a sectional view taken along line II-II in FIG. 1.
Figure 3:
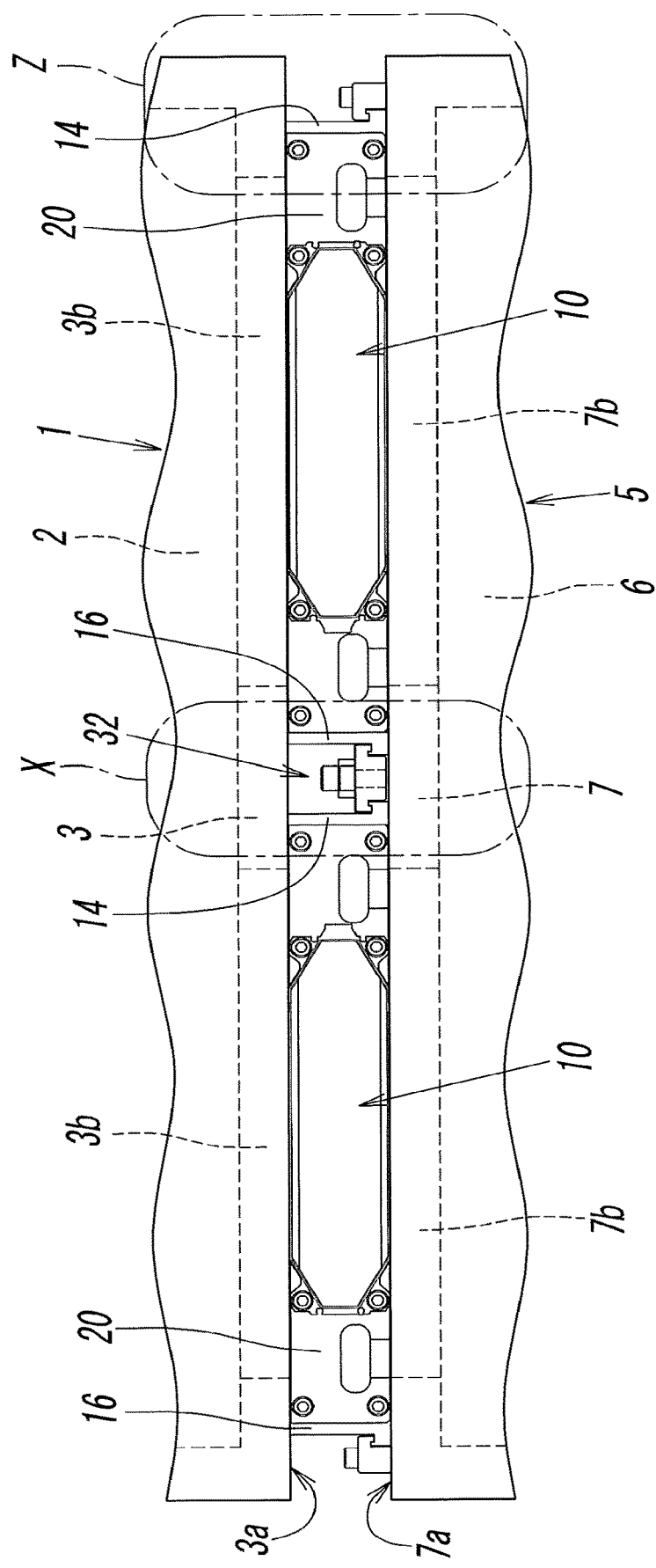
FIG. 3 is a bottom view in FIG. 2.
Figure 6A:
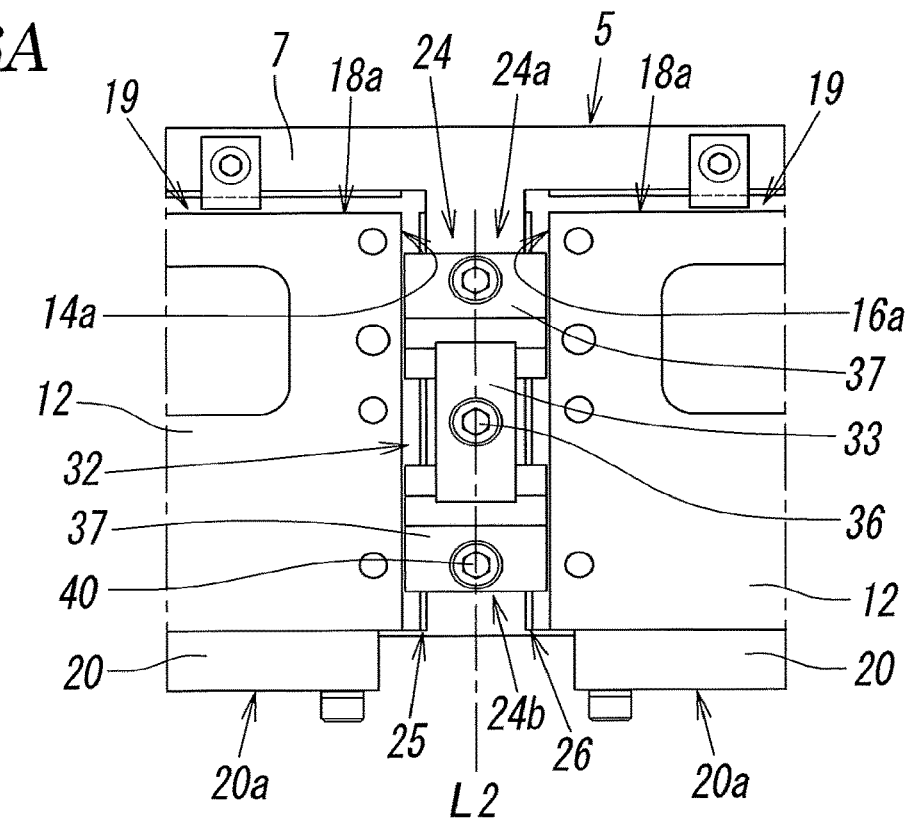
FIG. 6A is an enlarged view of part W in FIG. 2.
Figure 6B:
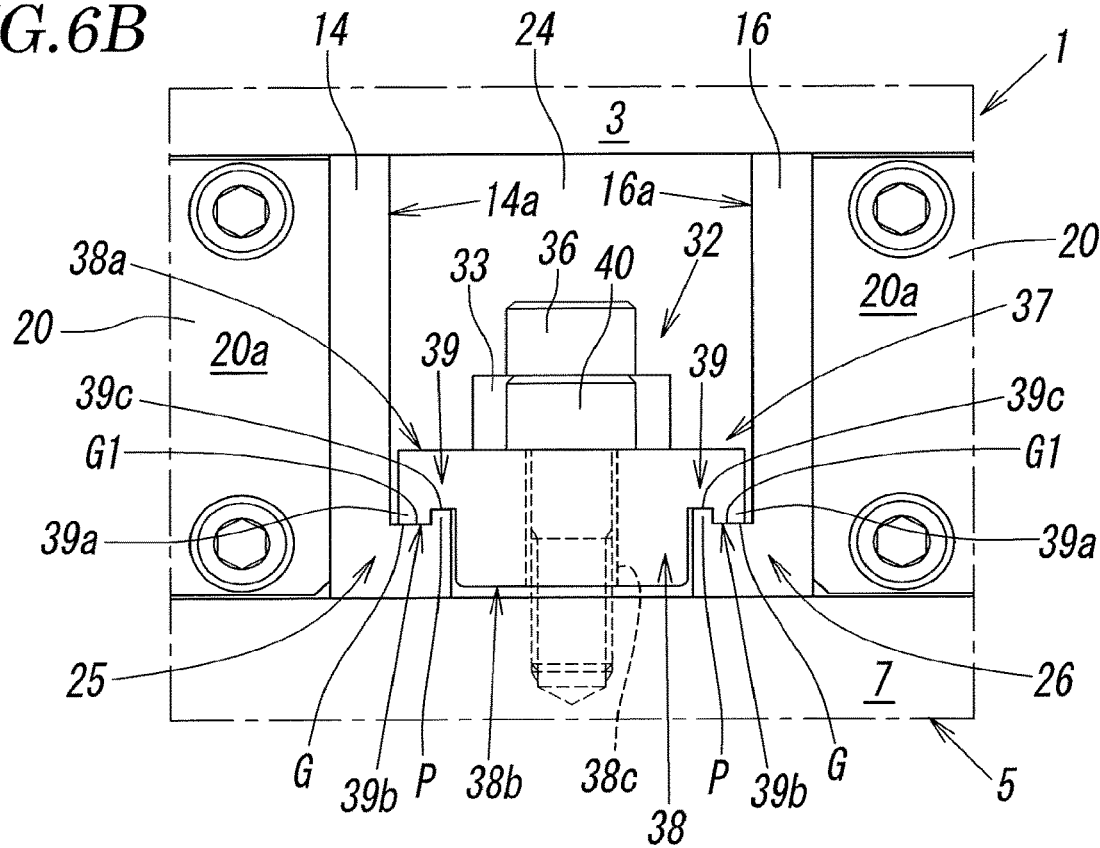
FIG. 6B is an enlarged view of part X in FIG. 3.

The side end faces 14a and 16a, which face each other, of the two adjacent gate valves 10, 10 define a fixing space 24 having a substantially rectangular cross-sectional shape. As illustrated in FIGS. 2 and 6, the fixing space 24 has an axis L2 vertically extending along the side ends of the valve side walls 12, 13, and has a first end 24a and a second end 24b in a direction along the axis L2 such that the first and second ends serve as openings. As illustrated in FIGS. 3 and 6, the fixing space 24 is defined as a square column having a substantially rectangular cross-sectional shape by four surfaces, that is, the paired side end faces 14a, 16a facing each other and the outer surfaces 3a, 7a of the first and second chamber walls 3, 7 facing each other. The paired side end faces 14a, 16a respectively include first and second protruding walls 25, 26 extending along the axis L2 such that the first and second protruding walls 25, 26 protrude at a right angle from the side end faces 14a, 16a into the fixing space 24, respectively.

Similarly, a third protruding wall 27 protrudes at a right angle from the second side end face 16a (the second side end face of the left gate valve in FIG. 2) of the one valve housing 11 including the first protruding wall 25 protruding from the first side end face 14a, and outwardly extends away from the first protruding wall 25. Similarly, a fourth protruding wall 28 protrudes at a right angle from the first side end face 14a (the first side end face of the right gate valve in FIG. 2) of the other valve housing 11 including the second protruding wall 26 protruding from the second side end face 16a, and outwardly extends away from the second protruding wall 26. In addition, a fifth protruding wall 19 extends in a longitudinal direction of the first peripheral end face 18a of each gate valve 10, and outwardly protrudes at a right angle from the first peripheral end face 18a.

Each of the protruding walls 19, 25 to 28 is an element used to fix the valve housings 11, 11 of the gate valves 10, 10 to the second chamber 5 by using clamp members 29 and a valve fixing mechanism 32, which will be described later. These protruding walls 19, 25 to 28 are arranged flush with the second side wall faces 13b (or serve as parts of the second side wall faces 13b). The clamp members 29 and the valve fixing mechanism 32 engage the protruding walls 19, 25 to 28, so that the protruding walls 19, 25 to 28 are pressed against the second chamber wall 7, and are in pressure contact with the outer surface 7a of the chamber wall 7. Consequently, the valve housings 11, 11 are airtightly fixed to the second chamber wall 7.

The protruding walls 19, 25 to 28 have the same cross-sectional shape, which is substantially L-shaped. An end of each protruding wall is bent at a right angle to the first chamber wall 3. Specifically, each of the protruding walls 19, 25 to 28 has in its end a projection P projecting toward the first chamber wall 3. The projection P and each of the end faces 14a, 16a, and 18a of the valve housing 11 define an engagement groove G opening toward the first chamber wall 3. The engagement groove G has a bottom parallel to the second side wall face 13b. The bottom of the engagement groove G serves as a pressed face G1 to be pressed by the clamp member 29 or the valve fixing mechanism 32.

Figure 7A:
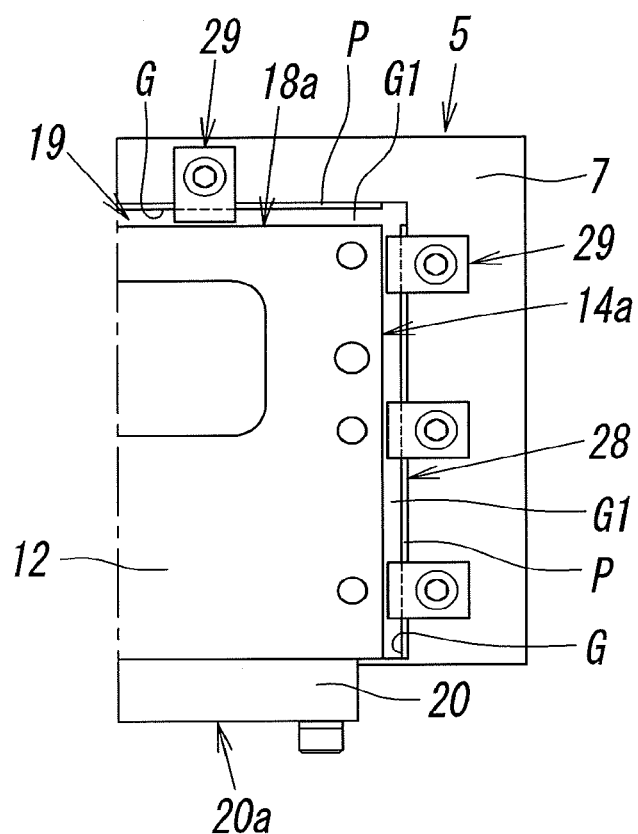
FIG. 7A is an enlarged view of part Y in FIG. 2.
Figure 7B:
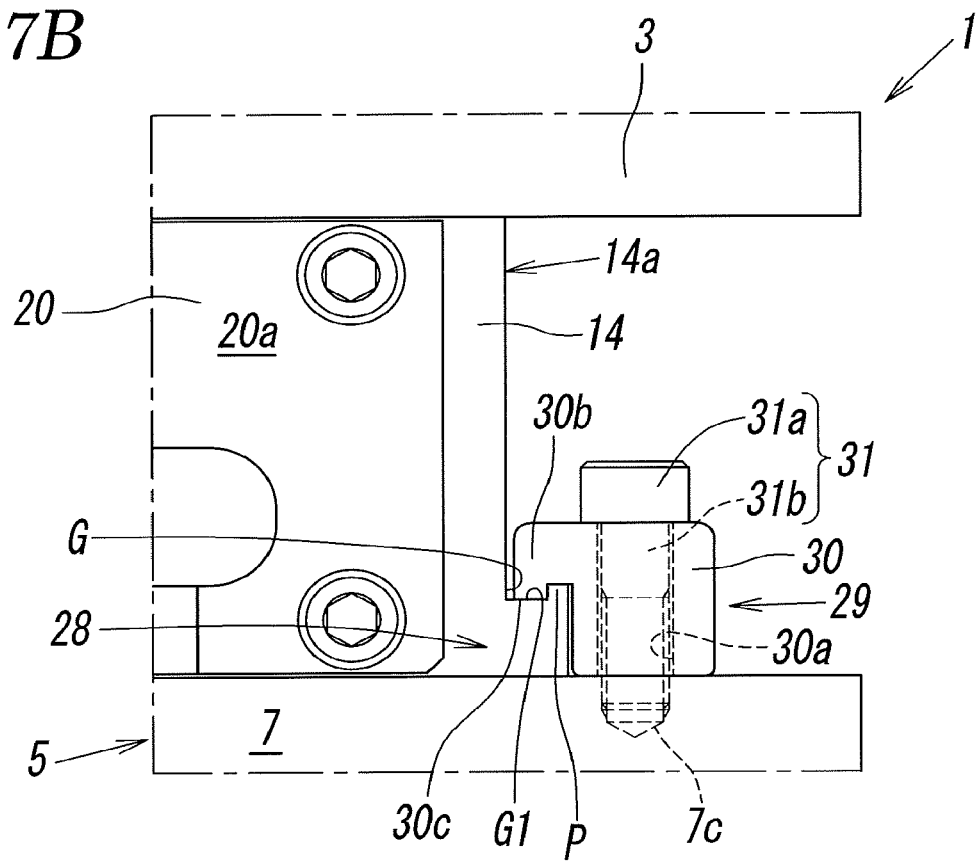
FIG. 7B is an enlarged view of part Z in FIG. 3.

As illustrated in FIG. 7, each clamp member 29 includes a clamp body 30 and a second fixing bolt 31 for fixing the clamp body 30 to the second chamber wall 7. The clamp body 30 has a through-hole 30a, through which the second fixing bolt 31 extends, and includes a substantially L-shaped claw 30b outwardly extending perpendicular to the through-hole 30a and including end part, which is bent to the second chamber wall 7 and is parallel to the through-hole 30a. The claw 30b has an end that serves as a pressing face 30c, which faces toward the second chamber wall 7 and is in contact with the pressed face G1 of the engagement groove G. The second fixing bolt 31 includes a screw head 31a having a larger diameter than the through-hole 30a and an externally threaded screw body 31b having a smaller diameter than the through-hole 30a. The second chamber wall 7 has a plurality of fixing screw holes 7c, in which the second fixing bolts 31 are screwed, arranged in positions where the clamp members 29 are attached.

The claws 30b of the clamp bodies 30 are engaged with the projections P and the engagement grooves G of the protruding walls arranged on the pair of valve housings 11, 11, that is, the third protruding wall 27, the fourth protruding wall 28, and the fifth protruding walls 19, and the second fixing bolts 31 extend through the through-holes 30a and are screwed in the fixing screw holes 7c. Consequently, the pressing faces 30c at the ends of the claws 30b are in contact with the pressed faces G1 of the engagement grooves G such that the third protruding wall 27, the fourth protruding wall 28, and the fifth protruding walls 19 are pressed against the second chamber wall 7. Thus, the second side wall faces 13b of the second valve side walls 13 are in pressure contact with the outer surface 7a of the second chamber wall 7. In the present embodiment, as illustrated in FIG. 2, the clamp members 29 are attached at three positions, namely, both the end parts and the intermediate part in the longitudinal direction of each of the third protruding wall 27, the fourth protruding wall 28, and the fifth protruding walls 19. This arrangement is not a limitation. The clamp members 29 may be attached at four or more positions in each protruding wall.

As illustrated in FIG. 6, the valve fixing mechanism 32 is received in the fixing space 24, and presses the first and second protruding walls 25, 26, which are similarly arranged in the fixing space 24, against the second chamber wall 7. Specifically, as illustrated in FIGS. 6, 10, 12, and 13, the valve fixing mechanism 32 includes a support member 33 fixed to the second chamber wall 7 in middle part of the fixing space 24 in the direction along the axis L2 and a pair of lever members 37, 37 arranged on both sides of the support member 33 in the direction along the axis L2. The lever members 37, 37 each include fulcrum part 37a supported by the support member 33, and press the protruding walls 25, 26 to the second chamber wall 7 by using the principle of leverage.

The support member 33 includes a strut 34, which is directly fixed to the second chamber wall 7 by a third fixing bolt 36 between the ends of the first and second protruding walls 25, 26 and protrudes toward the first chamber wall 3, and a pair of flanges 35, 35 extending from one end of the strut 34 in opposite directions toward the first end 24a and the second end 24b of the fixing space 24. The pair of flanges 35, 35 each have a surface facing the outer surface 7a of the second chamber wall 7, and the surface serves as a supporting portion (supporting face) 35a for supporting the fulcrum part 37a, which will be described later, of each of the pair of lever members 37, 37 while being in contact with the fulcrum part 37a.

The strut 34 of the support member 33 has in its central part a through-hole 34a extending orthogonal to the axis L2. The third fixing bolt 36 includes a screw head 36a having a larger diameter than the through-hole 34a and an externally threaded screw body 36b having a smaller diameter than the through-hole 34a. Furthermore, the second chamber wall 7 has a fixing screw hole 7d, in which the third fixing bolt 36 is screwed, at a position where the support member 33 is attached. The strut 34 is in contact with the outer surface 7a of the second chamber wall 7, and the third fixing bolt 36 extends through the through-hole 34a and is screwed in the fixing screw hole 7d. Thus, the support member 33 is fixed to the second chamber wall 7.

The pair of lever members 37, 37 each include the fulcrum part 37a, which is pressed in a direction from the second chamber wall 7 to the first chamber wall 3, in pressure contact with the supporting portion 35a of the corresponding one of the pair of flanges 35, 35 of the support member 33, a pair of load parts 37b in contact with the pressed faces G1 of the first and second protruding walls 25, 26 to exert a pressing force directed from the first chamber wall 3 on the second chamber wall 7, and effort part 37c to which a force directed from the first chamber wall 3 toward the second chamber wall 7 is applied by a fixing operation member 40, which will be described later. These lever members 37, 37 are mounted on both the sides of the support member 33 in the direction along the axis L2 in the fixing space 24 such that the effort parts 37c are located closer to the openings at the first end 24a and the second end 24b than the load parts 37b. The pressed faces G1 of the first and second protruding walls 25, 26 are formed of flat surfaces extending along the axis L2, and are parallel to the supporting faces 35a, similarly formed of flat surfaces, of the support member 33.

Figure 13:
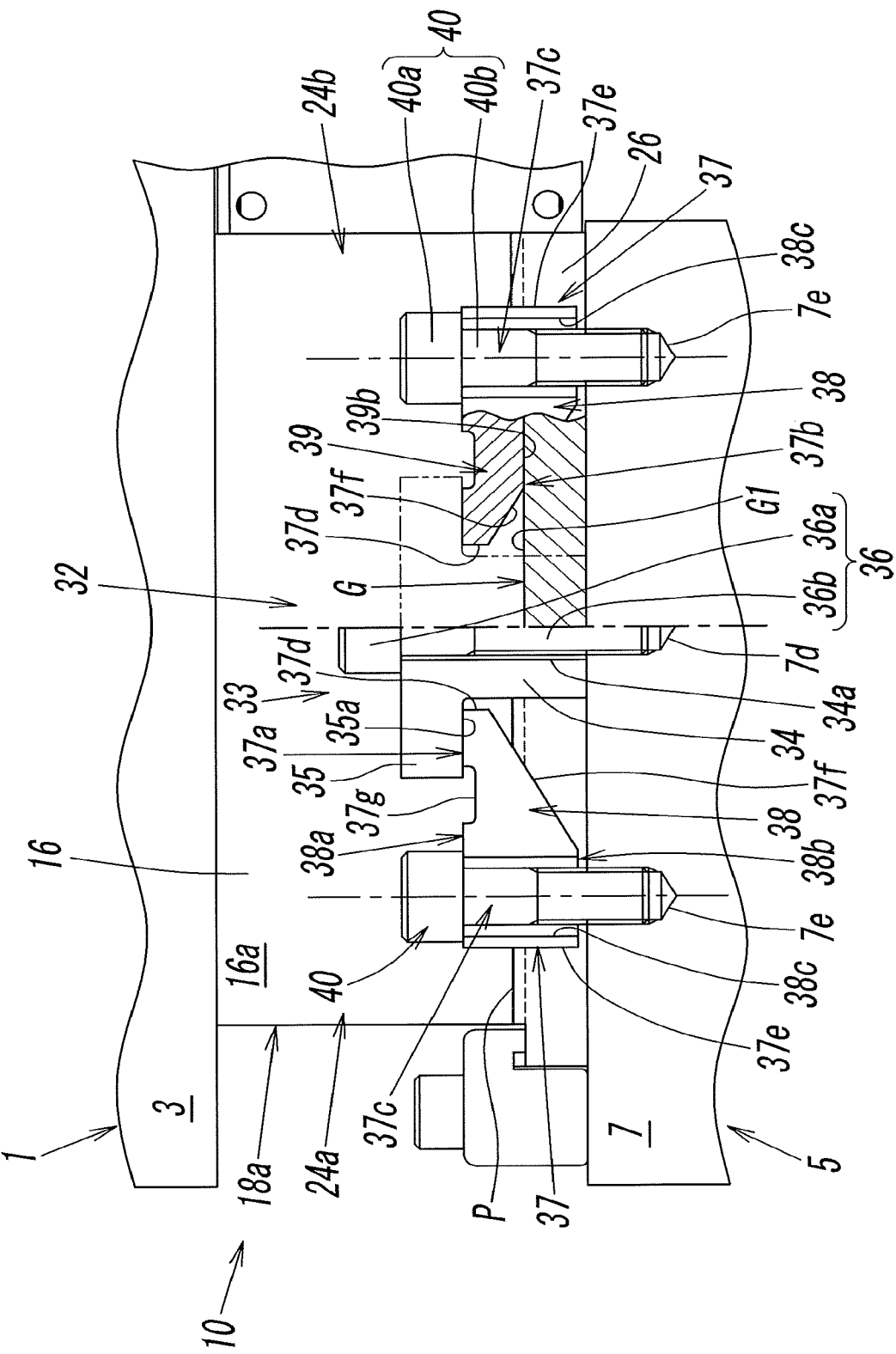
FIG. 13 is a schematic sectional view of essential part illustrating the mechanism for fixing the gate valves to the second chamber using the valve attaching mechanism, and illustrates the gate valves fixed by the valve fixing mechanism.

More specifically with reference to FIG. 13 in which the gate valves 10, 10 are airtightly fixed to the second chamber 5 by the valve fixing mechanism 32, each lever member 37 includes a block-shaped lever body 38 and a pair of lever engagement portions 39, 39, which are integrated with the lever body 38, protruding from opposite sides of the lever body 38 and extending along the axis L2, and has a front end 37d and a rear end 37e, serving as opposite ends in the direction along the axis L2.

The lever body 38 has a first face 38a and a second face 38b, which are parallel to the axis L2, facing away from each other. The lever body 38 further has a through-hole 38c, through which a fixing operation bolt, serving as the fixing operation member 40, extends, extending between the first face 38a and the second face 38b. The first face 38a is substantially parallel to and faces the outer surface 3a of the first chamber wall 3, and the second face 38b is substantially parallel to and faces the outer surface 7a of the second chamber wall 7. The pair of lever members 37, 37 are attached such that the front ends 37d, 37d of these members are located adjacent to the support member 33. The first faces 38a of the respective front ends 37d each serve as the fulcrum part 37a, which is formed of a flat surface, and are in contact with the supporting faces 35a of the support member 33. The through-hole 38c is an elongated hole having a length in the direction along the axis L2. Part surrounding the through-hole 38c serves as the effort part 37c to which a force is applied by the fixing operation bolt 40. Each lever member 37 further has in the first face a groove 37g located between the fulcrum part 37a and the effort part 37c (or the through-hole 38c) in the direction along the axis L2. The groove 37g extends across the width of the lever member 37 orthogonal to the axis L2.

The pair of lever engagement portions 39, 39 protruding from the opposite sides of the lever body 38 are located adjacent to and flush with the first face 38a, and extend in a direction orthogonal to the through-hole 38c. Each of the pair of lever engagement portions 39, 39 has in its end part an engagement protrusion 39a, formed by bending the end part toward the second face 38b (or the second chamber wall 7), such that the engagement protrusion 39a extends parallel to the through-hole 38c. The engagement protrusion 39a has at its end a pressing face 39b, which faces toward the second chamber wall 7 and is parallel to the fulcrum part 37a. The pressing faces 39b of the engagement protrusions 39a are in contact with the pressed faces G1 of the first and second protruding walls 25, 26. The engagement protrusions 39a, 39a of the pair of lever engagement portions 39, 39 and the opposite sides of the lever body 38 define therebetween engagement grooves 39c, 39c opening toward the second chamber wall 7. The engagement grooves 39c, 39c receive the projections P of the first and second protruding walls 25, 26, so that the paired protruding walls 25, 26 engage the pair of lever engagement portions 39, 39.

Furthermore, each lever member 37 has a sloping face 37f, which is located adjacent to the front end 37d and faces toward the second chamber 5, formed by gradually increasing the thickness of the lever member 37 from the front end 37d toward the rear end 37e (along the axis L2). In other words, the second face 38b of the lever member 37 is shorter than the first face 38a in the direction along the axis L2. The sloping face 37f allows the lever member 37 to be tapered from the second face 38b to the front end 37d.

As described above, making the thickness of the fulcrum part 37a of each lever member 37 smaller than a perpendicular distance between the supporting face 35a of the support member 33 and the pressed faces G1 of the paired protruding walls 25, 26 enables the fulcrum part 37a of the lever member 37 to be interposed between the supporting face 35a and the pressed faces G1 of the first and second protruding walls 25, 26. The boundaries between the sloping face 37f and the pressing faces 39b, 39b of the pair of lever engagement portions 39, 39 serve as the load parts 37b, 37b corresponding to the first and second protruding walls 25, 26. Specifically, the pressing faces 39b, 39b of the lever member 37 are formed of flat surfaces extending from the load parts 37b, 37b to the rear end 37e (end adjacent to the effort part).

The fixing operation bolt 40 includes a screw head 40a having a diameter larger than the width of the through-hole 38c, which is the elongated hole, and an externally threaded screw body 40b having a diameter smaller than the width of the through-hole 38c. The second chamber wall 7 has two fixing screw holes 7e, in which the fixing operation bolts 40 are screwed, at positions corresponding to the through-holes 38c, or positions adjacent to the openings at the first end 24a and the second end 24b of the fixing space 24. At least before a force is applied to each lever member 37 by using the fixing operation bolt 40, a perpendicular distance between the fulcrum part 37a, or the first face 38a, and the pressing faces 39b of the pair of lever engagement portions 39, 39 is slightly larger than the perpendicular distance between the supporting face 35a of the support member 33 and the pressed faces G1 of the paired protruding walls 25, 26.

A method of firmly attaching the two gate valves 10, 10 adjacent to each other between the first chamber 1 and the second chamber 5 will now be described. As illustrated in FIGS. 4 and 5, both the ends of the positioning pins 9 are fitted into the first positioning holes 17 arranged in the first and second side end walls 14, 16 of the respective valve housings 11 and the second positioning holes 3e arranged in the first chamber wall 3. Consequently, the two gate valves 10, 10 are positioned on the first chamber wall 3 such that the two chamber openings 3b, 3b of the first chamber 1 are aligned with the respective first gate openings 12a of the gate valves 10, 10. The first fixing bolts 8 are inserted from a side adjacent to the outer surface 7a of the second chamber wall 7 into the three fixing holes 15 arranged in each of the first and second side end walls 14, 16, and are screwed into the corresponding fixing screw holes 3d arranged in the first chamber wall 3. Thus, the two gate valves 10, 10 adjacent to each other are airtightly fixed to the first chamber wall 3.

Then, the support member 33 of the valve fixing mechanism 32 is fixed to the second chamber wall 7 by using the third fixing bolt 36 between the two chamber openings 7b, 7b arranged in the second chamber 5. The two chamber openings 7b, 7b of the second chamber 5 are aligned with the respective second gate openings of the two gate valves 10, 10. Under such conditions, as illustrated in FIGS. 2 and 7, the clamp members 29 are engaged with at least three portions, that is, both the end parts and the intermediate part in the longitudinal direction of each of the third protruding wall 27, the fourth protruding wall 28, and the fifth protruding walls 19, 19 arranged around the paired gate valves 10, 10, and are fixed to the second chamber wall 7 by using the second fixing bolts 31. Consequently, the clamp members 29 press the third protruding wall 27, the fourth protruding wall 28, and the fifth protruding walls 19, 19 against the second chamber wall 7, so that the pair of gate valves 10, 10 are temporarily fixed to the second chamber wall 7. At this time, the fixing space 24 having a predetermined width is defined between the valve housings 11, 11. The operation of fixing the gate valves 10 with the clamp members 29 is performed in a gap, which corresponds to the thickness of the gate valves 10, defined between the first chamber wall 3 and the second chamber wall 7.

Subsequently, in the fixing space 24, the valve fixing mechanism 32 is used to exert a pressing force directed toward the second chamber wall 7 on the first and second protruding walls 25, 26 and to completely fix the pair of gate valves 10, 10 to the second chamber wall 7. This operation is performed through the openings at the first end 24a and the second end 24b of the fixing space 24.

Figure 12:
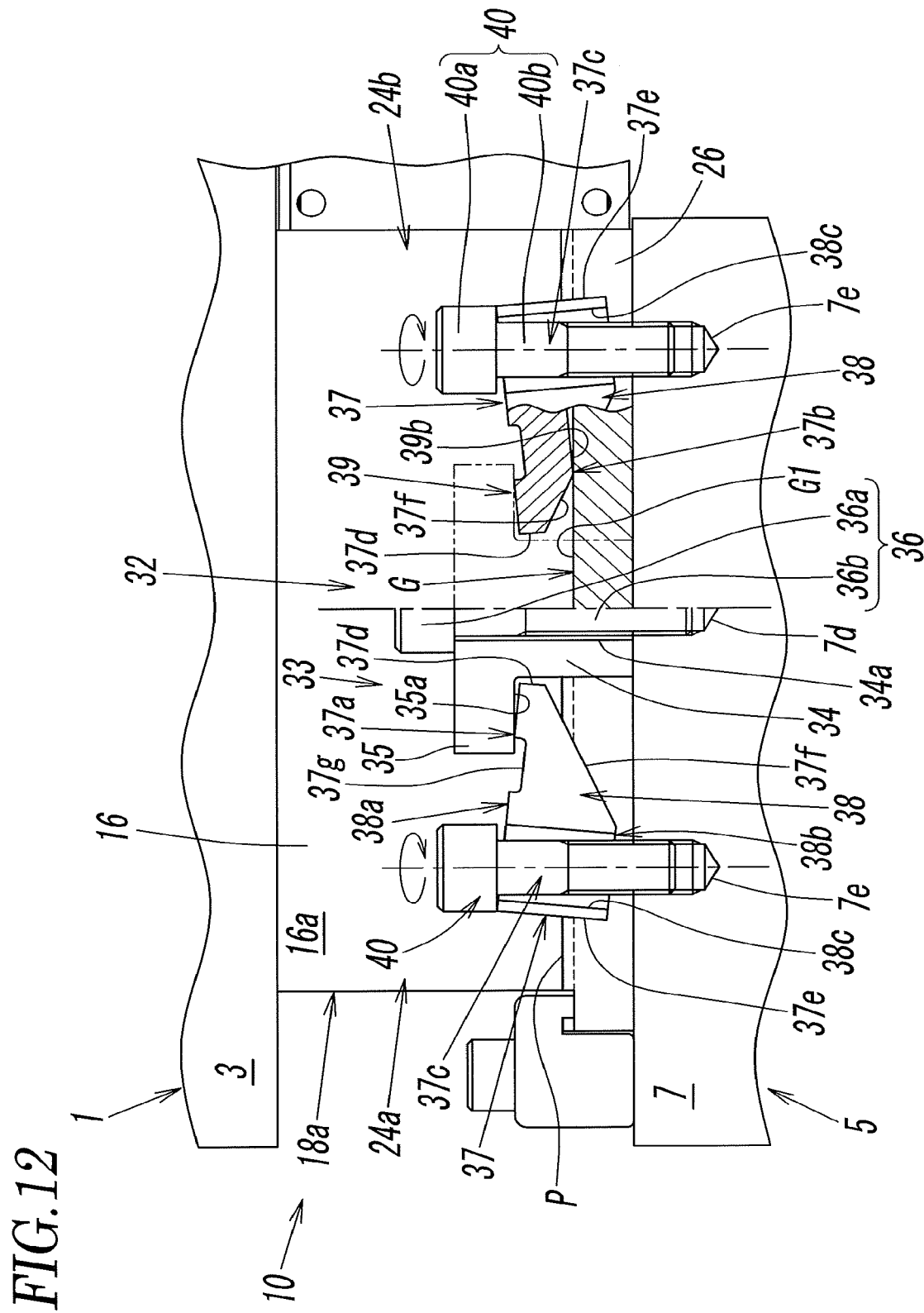
FIG. 12 is a schematic sectional view of essential part illustrating a mechanism for fixing the gate valves to the second chamber using a valve attaching mechanism, and illustrates the gate valves before being fixed by a valve fixing mechanism.

Specifically, as illustrated in FIG. 12, the front ends 37d, each including the fulcrum part 37a, of the pair of lever members 37, 37 are inserted between the supporting faces 35a of the support member 33 and the pressed faces G1 of the first and second protruding walls 25, 26. At this time, since the perpendicular distance between the fulcrum part 37a of each lever member and the pressing faces 39b is slightly larger than the perpendicular distance between each supporting face 35a of the support member 33 and the pressed faces G1 of the first and second protruding walls 25, 26 as described above, the lever member 37 is inclined forward such that the front end 37d of the lever member is located closer to the second chamber wall 7 than the rear end 37e thereof. In such a forward inclined state, the boundaries, serving as the load parts 37b, between the sloping face 37f and the pair of pressing faces 39b, 39b are in contact with the pressed faces G1 of the first and second protruding walls 25, 26.

The fixing operation bolt 40 is then inserted into each of the through-holes 38c of the lever members 37, 37. As the bolt is tightened by using a tool inserted through the openings at the first end 24a and the second end 24b, the screw head 40a of the bolt applies a force to (or presses) the effort part 37c of the lever member 37 against the second chamber. At this time, since the fixing operation bolts 40 are arranged adjacent to the openings at the first end 24a and the second end 24b of the fixing space 24, this arrangement allows a space necessary for operating the fixing operation bolts with a tool to be left.

When a force is applied to the effort part 37c as described above, the load parts 37b, 37b of the lever member 37 press the first and second protruding walls 25, 26 against the second chamber wall 7, which is based on the principle of leverage. When the fixing operation bolt 40 is completely tightened as illustrated in FIG. 13, the pair of pressing faces 39b, 39b in the load parts 37b and the effort part 37c are in contact with the pressed faces G1 of the first and second protruding walls 25, 26, so that these protruding walls 25, 26 are pressed against the second chamber wall 7. Consequently, the gate valves 10, 10 are airtightly fixed to the second chamber 5.

As described above, in the present embodiment, the fixing operation bolts 40 of the valve fixing mechanism 32 are arranged adjacent to the opposite ends of the fixing space 24 in the direction along the axis L2, that is, the openings at the first end 24a and the second end 24b of the fixing space 24 defined between the valve housings 11, 11 of the gate valves 10, 10 adjacent to each other. Each of the fixing operation bolts 40 applies a force to the effort part 37c of the lever member 37 against the second chamber wall 7, and simultaneously presses the first and second protruding walls 25, 26 against the second chamber wall 7 through the lever member 37.

Specifically, based on the principle of leverage, a pressing force directed toward the second chamber wall 7 is exerted on the pressed faces G1 of the first and second protruding walls 25, 26 through the lever members 37 in the middle part of the fixing space 24 in the direction along the axis L2 as well as in the opposite ends thereof. This enables the gate valves 10, 10 to be fixed to the second chamber 5 while the side wall faces 13b of the second valve side walls 13 are airtightly pressed against the outer surface 7a of the second chamber wall 7 in the middle part of the fixing space 24 in the direction along the axis L2 as well as in the opposite ends thereof.

Thus, the first and second chambers 1, 5 and the two gate valves 10, 10 arranged adjacent to each other between the chambers 1, 5 can be coupled to one another with enhanced airtightness.

Although one embodiment of the gate-valve attaching structure according to the present invention has been described in detail, the embodiment is not intended to limit the present invention. It is needless to say that various design modifications can be made without departing from the spirit and scope of the present invention.

For example, in the above-described embodiment, each of the number of chamber openings 3b of the first chamber 1, the number of chamber openings 7b of the second chamber 5, and the number of gate valves 10 is two. The arrangement is not limited to this example. Three or more chamber openings and three or more gate valves may be arranged. For the forms of the support member 33 and the lever member 37 of the valve fixing mechanism 32, various modifications can be used as long as the fulcrum part 37a, the load part 37b, and the effort part 37c are arranged in the above-described order.

REFERENCE SIGNS LIST

1: first chamber (transfer chamber)
3: first chamber wall
3b: first chamber opening
5: second chamber (processing chamber)
7: second chamber wall
7b: second chamber opening
10: gate valve
11: valve housing
12a: first gate opening
12b: first side wall face
13a: second gate opening
13b: second side wall face
14a: first side end face
16a: second side end face
21: valve body
22: valve drive unit
23: valve shaft
24: fixing space
24a: first end
24b: second end
25: first protruding wall
26: second protruding wall
32: valve fixing mechanism
33: support member
34: strut
35: flange
35a: supporting portion (supporting face)
37: lever member
37a: fulcrum part
37b: load part
37c: effort part
37d: front end
37e: rear end
37f: sloping face
38: lever body
38a: first face
38b: second face
38c: through-hole
39: lever engagement portion
39a: engagement protrusion
39b: pressing face
39c: engagement groove
40: fixing operation member (fixing operation bolt)
40a: screw head
40b: screw body
L1: axis (axis of shaft)
L2: axis (axis of fixing space)
P: projection
G: engagement groove
G1: pressed face

The invention claimed is:

1. A gate-valve attaching structure for firmly attaching a plurality of gate valves adjacent to each other between a first chamber and a second chamber each having a plurality of chamber openings,
wherein each gate valve includes a hollow valve housing having a pair of gate openings, a valve body moving in the valve housing to establish or interrupt communication between the pair of gate openings, and a valve drive unit operating the valve body,
wherein the valve housing has a pair of side wall faces having the gate openings and facing away from each other and a pair of side end faces coupling opposite side ends of the side wall faces and facing away from each other, and is fixed to both the first chamber and the second chamber such that the pair of gate openings are connected to the chamber openings of the first and second chambers and the pair of side wall faces are airtightly pressed against the first and second chambers,
wherein the side end faces, facing each other, of the valve housings of adjacent gate valves define a fixing space having an axis extending along the side ends of the side wall faces, the fixing space has a first end and a second end in a direction along the axis, the first and second ends serve as openings, the side end faces facing each other include a pair of protruding walls extending along the axis and protruding from the respective side end faces into the fixing space, and the fixing space accommodates a valve fixing mechanism for fixing the gate valves to the second chamber, and
wherein the valve fixing mechanism includes a support member fixed to the second chamber in middle part of the fixing space in the direction along the axis, a pair of lever members each including fulcrum part in pressure contact with a supporting portion, facing toward the second chamber, of the support member, load part in contact with the pair of protruding walls to exert a pressing force on the second chamber, and effort part to which a force directed toward the second chamber is applied, and a pair of fixing operation members applying the force to the effort part of each lever member and pressing the pair of protruding walls against the second chamber, and the pair of lever members are arranged on both sides of the support member in the direction along the axis such that the effort parts of the lever members are located closer to the openings at the first and second ends than the load part.

2. The gate-valve attaching structure according to claim 1, wherein the support member includes a strut extending from the second chamber and a pair of flanges extending from the strut toward the openings at the first and second ends, and the flanges each have a surface that faces toward the second chamber and serves as the supporting portion.

3. The gate-valve attaching structure according to claim 2, wherein each lever member has a surface facing toward the second chamber, the surface is a sloping face formed by gradually increasing a thickness of the lever member along the axis from an end adjacent to the fulcrum part to the load part, and the thickness of the fulcrum part of the lever member is smaller than a perpendicular distance between the supporting portion of the support member and pressed faces, which are in contact with the load part, of the pair of protruding walls.

4. The gate-valve attaching structure according to claim 3, wherein each of the pressed faces of the pair of protruding walls is formed of a flat surface extending along the axis, each lever member has a flat pressing face extending along the axis from the load part to an end adjacent to the effort part, and the pressing face is in contact with a pressed face of the pressed faces to press the pair of protruding walls against the second chamber.

5. The gate-valve attaching structure according to claim 4, wherein the supporting portion of the support member is formed of a flat surface parallel to the pressed faces of the pair of protruding walls, and the fulcrum part of each lever member is formed of a flat surface parallel to the pressing face.

6. The gate-valve attaching structure according to claim 1, wherein each fixing operation member is a fixing operation bolt, the fixing operation bolt extends through a through-hole provided in the effort part of each lever member and is screwed in a screw hole provided in the second chamber, the force directed toward the second chamber is applied to the effort part, and the load part and the effort part of the lever member are in contact with the pair of protruding walls to press the protruding walls against the second chamber.

7. The gate-valve attaching structure according to claim 6, wherein the fixing operation bolt includes an externally threaded screw body and a screw head joined to the screw body and having a larger outside diameter than the screw body, the through-hole of the lever member is an elongated hole having a length in the direction along the axis, the through-hole has a width smaller than the outside diameter of the screw head, and the screw head applies the force directed toward the second chamber to the effort part of the lever member.

8. The gate-valve attaching structure according to claim 6, wherein the pair of protruding walls each have a pressed face, formed of a flat surface extending along the axis, with which the load part is in contact, the lever member has a flat pressing face extending along the axis from the load part to an end adjacent to the effort part, and the pressing face is in contact with a pressed face of the pressed faces to press the pair of protruding walls against the second chamber.

9. The gate-valve attaching structure according to claim 8, wherein the supporting portion of the support member is formed of a flat surface parallel to the pressed faces of the pair of protruding walls, and the fulcrum part of the lever member is formed of a flat surface parallel to the pressing face.

* * * * *